United States Patent
Ferrant et al.

(10) Patent No.: US 6,477,673 B1
(45) Date of Patent: Nov. 5, 2002

(54) STRUCTURE AND METHOD WITH WHICH TO GENERATE DATA BACKGROUND PATTERNS FOR TESTING RANDOM-ACCESS-MEMORIES

(75) Inventors: Richard J. Ferrant, St. Ismier (FR); Robert Alan Wadsworth, Coppell, TX (US)

(73) Assignee: STMicroelectronics, Inc., Carrollton, TX (US)

(*) Notice: Subject to any disclaimer, the term of this patent is extended or adjusted under 35 U.S.C. 154(b) by 0 days.

(21) Appl. No.: 09/365,125

(22) Filed: Jul. 30, 1999

(51) Int. Cl.[7] .............................................. H04B 17/00
(52) U.S. Cl. ..................................... 714/728; 714/724
(58) Field of Search ................................ 714/738, 739, 714/728, 724

(56) References Cited

U.S. PATENT DOCUMENTS

| | | | |
|---|---|---|---|
| 5,703,818 A | 12/1997 | Osawa | ........................ 365/201 |
| 5,848,074 A | 12/1998 | Maeno | ....................... 371/21.3 |
| 5,925,142 A | * 7/1999 | Raad et al. | |
| 5,946,246 A | * 8/1999 | Jun et al. | |

FOREIGN PATENT DOCUMENTS

| WO | WO 89/09471 | 10/1989 | ........... G11C/29/00 |
|---|---|---|---|

* cited by examiner

Primary Examiner—Phung M. Chung
(74) Attorney, Agent, or Firm—Lisa K. Jorgenson; Renee M. Larson

(57) ABSTRACT

Programmability of the data background patterns used to test random-access-memories (RAMs) is accomplished by adding to the memory input/output (I/O) buffers of RAM memory, for each data bit of a data background pattern to be programmed, a programming mechanism and a selection mechanism. The programming mechanism is capable of programming a data bit of the data background pattern in accordance with a programming information signal provided to the RAM. The selection mechanism provides either the programmed data bit or a normal, application data bit to an input/output buffer of the RAM in accordance with whether the RAM is in a test mode or a normal operating mode, as indicated by a test control signal provided to the RAM.

20 Claims, 2 Drawing Sheets

STRUCTURE AND METHOD WITH WHICH TO GENERATE DATA BACKGROUND PATTERNS FOR TESTING RANDOM-ACCESS-MEMORIES

BACKGROUND OF THE INVENTION

1. Field of the Invention

This invention relates generally to integrated circuits memory devices, and more particularly to an improved apparatus and method for generating data background patterns used for testing random access memories.

2. Background of the Invention

Random access memories (RAMs) are typically tested using an external test machine, such as a state machine, or a built-in-self-test (BIST) machine that provides predefined patterns able to identify faulty memory cells of the memory array. Testing aids in the discovery of certain faulty cells and is key to the proper characterization of the RAM. For both the external test machine and the BIST machine cases the predefined patterns are defined by engineers and can be considered sufficiently discriminatory to provide an adequate information concerning the state of one or more memory cells, whether it be a good, repairable, or fail state, for instance. A predefined testing pattern may be thought of as having two parts. The first part includes the commands, such as read, write, wait, etc., for testing the memory cells and the addresses of the memory cells to be tested. The second part of a predefined pattern is the pattern itself comprised of the data pattern and the background pattern.

So-called "march" patterns are commonly used to test RAM memories. There are many different march patterns available for testing memories; a few march patterns commonly used to test memories include MATS, MATS+, MATS++, MARCHX, MARCHC-, MARCHA, MARCHY, MARCHB, MARCHLR, MARINESCU. Not all march testing patterns detect all faults of a RAM and thus different types of march testing patterns are used to detect different RAM faults. Some types of march patterns are designed to target specific types of faults while others seek to identify as many faults as possible. The various types of faults that can be identified by march testing patterns include stuck at faults (SAFs), transition faults (TFs), coupling faults (CFs), address decoder faults (AFs), state coupling faults (SCFs), and bridging faults (BFs). The common characteristic of all march patterns, however, is that a sequence of events, such as reads and writes, for instance, are applied to one address of the memory array before moving onto the next address of the memory array being tested. This testing sequence is repeated in an ascending or descending order, as dictated by the particular march algorithm, throughout the address space being tested.

The testing of word-oriented memories which have more than 1-bit per word present a special testing problem. In a word-oriented memory, allowances have to be made to the traditional march patterns in order to accommodate the detection of a special set of faults, called intraword faults, that exist between two or more bits of a word in a memory array. Typically intraword faults are identified by applying traditional march patterns to a word-oriented memory and repeating the test the required number of times using multiple data backgrounds, where the data background refers to the data applied to a complete word. As an example, consider the following simple sequence of a march pattern:

/{w0r0w1r1} which means to "write zero, read zero, write 1, read 1" starting at the lowest memory address and progressing to the highest memory address of the memory array to be tested. This sequence is very straightforward for a single-bit-wide memory, but is more complex for a word-oriented memory in which the '0' means "data background" and the '1' means "inverted data background." So, '0' might be represented by any of the following data background patterns: 00000000, 01010101, 00110011, 00001111; '1' would be represented by the inverse of these data background patterns. To apply these background patterns, the marching pattern algorithm would be repeated using each of these background patterns in place of the '1' or '0' in the above sequence. Thus for an 8-bit wide memory there are 256 possible data backgrounds implicated by this sequence. Typically, however, only $\log 2^{N+1}$ data backgrounds, where N refers to the number of bits per word, are used in order to help reduce testing time.

Compounding the complexity of testing word-oriented memories is the ever-increasing width of the data bus of the memory array. Current data bus widths of memory devices are 64 bits and data bus widths upwards of 256/512 bits are expected in the near future. The increased width of the data bus is exponential in nature, doubling about every 9 to 10 months or so. In the case of an external test machine, such increased data bus widths cannot be easily handled by an external tester because the number of package pins is strictly limited by the application. For instance, a package housing a memory array device might have only 100 to 200 pins, a number of pins insufficient to handle testing a data bus having a width of 256 or 512 bits.

The internal BIST machine solution, while it does not have this pin-out limitation, is a problematic solution in its own right. With the always increasing width of the data bus, the BIST machine that provides patterns and backgrounds becomes more and more complex, each individual data needing a driver and more complex algorithms to properly test the memory. The number of gates of the BIST machine can be expected to increase at least at the same rate of increase of the data bus width, if not more, as the number of requested data backgrounds required to completely test the memory array may increase more rapidly. In order for the BIST solution to support greatly expanded data bus widths, a large number of signals which occupy a large area of the routing channel of the memory is called for. Moreover, the BIST machine solution is a solid-state solution embedded in the silicon of the memory array device and is therefore inherently inflexible with regard to the type of patterns that it employs to test the memory array. The BIST machine is hard to modify should a pattern be missing Using the BIST solution, it is impossible to later add a "forgotten" pattern without fabricating a new maskset for the BIST circuitry since the BIST solution is embedded in silicon.

Referring to FIG. 1, a block diagram illustrates a possible scenario for testing an embedded memory array that is controlled by a controller of the device on which the memory is embedded. The data patterns for testing the memory are provided by a test machine which may be either a BIST machine or an external test machine, as discussed above. The testing data provided by the test machine is multiplexed with information from the controller as shown. Information from the memory array is likewise multiplexed before being provided to the controller that in turn provides the results of the memory testing to the test machine. The greatly increased number of gates required in the test machine, particularly if the test machine is a BIST machine, as well as the number of multiplexers required to adequately test RAMs having ever-increasing data bus widths can serious degrade device performance. These increased demands in silicon are evidenced by the great number of wires, or routing, that is illustrated between the test machine and the multiplexer circuitry, between the multiplexer circuitry and the memory array, and between the multiplexer circuitry and the controller.

From the foregoing description, it can be seen that there is a need in the art to have an improved method and structure for the testing of RAMs. The improved method and structure should accommodate testing of RAMs having ever-increasing data bus widths by both BIST machines and external test machines. The number of additional package pins and additional silicon of the RAM should be kept to a minimum while providing for maximum testing flexibility.

SUMMARY OF THE INVENTION

According to the principles of the present invention, an improved apparatus and method for generating data background patterns for testing random-access-memories is provided. The improved apparatus of the present invention includes circuitry of a RAM that comprises a programming element and a selection element. The programming element is able to selectively program desired bits of a data background pattern according to a programming information signal provided to the RAM in order to generate a programmed data background pattern. The selection element receives the programmed data background pattern as well as a normal, application data and selects and outputs to an input/output buffer of the RAM either the programmed data background pattern or application data according to the logic state of a test control signal. There is one placement per data bit of the data background pattern of circuitry that accomplishes the mandates of the programming and selection elements. According to a preferred embodiment of the present invention, for each data bit of the data background pattern the programming element comprises a shift register element that receives a programming information signal and a clock signal and shifts in and outputs the programming information signal in accordance with the clock signal and a logic element that receives the programming information signal from the shift register and a data bit of a data background pattern and performs an exclusive-or (XOR) function on the programming information signal and the data bit of the data background pattern to generate a programmed data bit. For each data bit of the data background pattern the selection element comprises a multiplexer element controlled by a test control signal that receives an application data bit and the programmed data bit, wherein when the test control signal is a first logic state indicative of a testing mode of the RAM the multiplexer element selects and outputs the programmed data bit to an input/output buffer of the RAM and when the test control signal is a second logic state indicative of a normal operating mode of the RAM the multiplexer element selects and outputs the application data bit to the input/output buffer of the RAM.

The methodology of the present invention accomplishes the goal of programmability of data background patterns used to test a RAM by providing a data background pattern to the RAM, providing a programming information signal to the RAM, selectively programming the data bits of the data background pattern in accordance with the programming information signal to generate a programmed test data pattern, and providing the programmed test data pattern to an input/output buffer of the RAM when the RAM is in a testing mode as indicated by a test control signal. The methodology is further capable of providing an application data to the input/output data when the RAM is in a normal operating mode as indicated by the test control signal. According to the preferred embodiment of the invention, the programming information signal is provided to the RAM by using a shift register to shift in this information and programmability of the various bits of the data background pattern are programmed using an exclusive-OR (XOR) gating function that receives the programming information signal and an appropriate bit of the data background pattern. Of course, one skilled in the art may accomplish the methodology of the present invention using a different structure on the RAM so long as the functionality of the methodology is accomplished.

The above as well as additional objectives, features, and advantages of the present invention will become apparent in the following detailed written description.

BRIEF DESCRIPTION OF THE DRAWINGS

The novel features believed characteristic of the invention are set forth in the claims. The invention itself, however, as well as the preferred mode of use, and further objects and advantages thereof, will best be understood by reference to the following detailed description of an illustrative embodiment when read in conjunction with the accompanying drawings, wherein:

DESCRIPTION OF THE INVENTION

Figure 1:
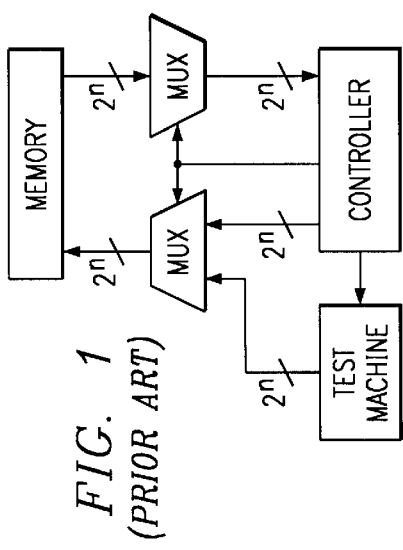
FIG. 1 is a representative block diagram for testing an embedded memory array, according to the prior art.

The improved circuitry structure of the present invention consists of adding to the memory input/output (I/O) buffers of an embedded RAM memory one or more shift registers that may be used as programming mechanism for data background patterns, akin to a "mask," although not in silicon, to selectively invert or not invert the data background patterns and thereby provide programmability of the types and compositions of data background patterns used to test the memory. Using the present invention, the I/O buffers are able to provide any data background for testing of a random access memory device. The present invention especially lends itself to the testing of word-oriented RAM memories characterized as having more than 1-bit per word.

A shift register and gating circuitry is added to the I/O buffer of the embedded memory array for each data bit of the address data bit for which programmability is desired. Referring now to circuitry 10 of FIG. 2, by way of illustration three placements 20, 40, and 60 of the present invention, one for each of three data bits present on the DATA_IN_TEST bus 15 in this particular example. It will be recognized in the art that the number of placements of the invention is a function of the number of data bits present on the DATA_IN_TEST bus 15. Each placement of the invention includes a shift register that receives and shifts in programming information according to a clock signal, an exclusive-OR (XOR) gate or its equivalent that receives the output signal from the preceding shift register and gates it with the $DATA_{13}$ IN_TEST data bit provided to it, and a multiplexer. The multiplexer selects and outputs the output of the XOR gate in the test mode when the TEST control signal is a high logic state and selects and outputs application data provided to it when the TEST control signal is a low logic state. It is noted that the programming information signal 26 of the first shift register 22 is provided externally to circuitry 10 by an on-chip BIST machine or an external tester, while the programming information signal of subsequent shift registers is provided by the output signal of the preceding shift register. Thus, the programming information signal of shift register 42 is the output signal 28 of the preceding shift register 22 and similarly the programming information signal of shift register 62 is the output signal 44 of its preceding shift register 42.

Each placement of the invention will now be described in detail. Referring first to placement 20, shift register 22 shifts in programming information signal 26 in accordance with clock signal 24 and outputs signal 28. Signal 28 is the input programming information signal to subsequent shift register 42 in placement 40 as well as being an input to XOR gate 30. The logic state of signal 28 determines whether data bit 15$i$ of DATA_IN_TEST bus 15, the other input signal to XOR gate 30, is inverted. If signal 28 is a high logic state (Q=1) than data bit 15$i$ is inverted, but if signal 28 is a low logic state (Q=0) than data bit 15$i$ is not inverted. The output signal 31, then, of XOR gate 30 reflects the appropriate, i.e. inverted or non-inverted, state of data bit 15$i$. At multiplexer 36, data bit DINi 32 is multiplexed with a single input DATA_IN_TEST bit 31 representative of regular application data to be provided to the I/O buffers of the RAM when in a non-testing, normal operation mode. The TEST control signal 34 indicates whether the RAM is in a testing mode or a normal operating mode and thus which input data to the multiplexer, the regular data Din or the test data output from the XOR gate, will be selected and passed through to the I/O buffers (read or write) of the RAM. When TEST control signal 34 is a high ("1") logic state, the RAM test mode is indicated and thus the output signal 31 of XOR gate 30 is selected and passed through the multiplexer 36 as signal 38. When, on the other hand, TEST control signal 34 is a low ("0") logic state, the RAM is in the normal operating mode and thus the normal application data DINi 32 is selected by multiplexer 36 and passed through as signal 38.

The second placement 40 of the present invention operates in a similar manner. Shift register 42 shifts in programming information signal 28, generated by shift register 22, in accordance with clock signal 24 and outputs signal 44. Signal 44 is the input programming information signal of subsequent shift register 62 in placement 60 as well as being an input to XOR gate 66. The logic state of signal 44 determines whether data bit 15$j$ of DATA_IN_TEST bus 15, the other input signal to XOR gate 46, is inverted. If signal 44 is a high logic state (Q=1) than data bit 15$j$ is inverted, but if signal 44 is a low logic state (Q=0) than data bit 15$j$ is not inverted. The output signal 48, then, of XOR gate 46 reflects the appropriate, i.e. inverted or non-inverted, state of data bit 15$j$. At multiplexer 54, data bit DINj 50 is multiplexed with a single input DATA_IN_TEST bit 48 representative of regular application data to be provided to the I/O buffers of the RAM when in a non-testing, normal operation mode. The TEST control signal 34 indicates whether the RAM is in a testing mode or a normal operating mode and thus which input data to the multiplexer, the regular data Din or the test data output from the XOR gate, will be selected and passed through to the I/O buffers (read or write) of the RAM. When TEST control signal 34 is a high ("1") logic state, the RAM test mode is indicated and thus the output signal 48 of XOR gate 46 is selected and passed through the multiplexer 54 as signal 56. When, on the other hand, TEST control signal 34 is a low ("0") logic state, the RAM is in the normal operating mode and thus the normal application data DINj 50 is selected by multiplexer 54 and passed through as signal 56.

Referring now to the third placement 60, shift register 62 shifts in programming information signal 44 in accordance with clock signal 24 and outputs signal 64. Signal 64 is the input programming information signal to a shift register is any subsequent placements of the invention (not shown) as well as being an input to XOR gate 66. The logic state of signal 64 determines whether data bit 15$k$ of DATA_IN_TEST bus 15, the other input signal to XOR gate 66, is inverted. If signal 64 is a high logic state (Q=1) than data bit 15$k$ is inverted, but if signal 64 is a low logic state (Q=0) than data bit 15$k$ is not inverted. The output signal 68, then, of XOR gate 66 reflects the appropriate, i.e. inverted or non-inverted, state of data bit 15$k$. At multiplexer 72, data bit DINk 70 is multiplexed with a single input DATA_IN_TEST bit 68 representative of regular application data to be provided to the I/O buffers of the RAM when in a non-testing, normal operation mode. The TEST control signal 34 indicates whether the RAM is in a testing mode or a normal operating mode and thus which input data to the multiplexer, the regular data Din or the test data output from the XOR gate, will be selected and passed through to the I/O buffers (read or write) of the RAM. When TEST control signal 34 is a high ("1") logic state, the RAM test mode is indicated and thus the output signal 68 of XOR gate 66 is selected and passed through the multiplexer 72 as signal 74. When, on the other hand, TEST control signal 34 is a low ("0") logic state, the RAM is in the normal operating mode and thus the normal application data DINk 70 is selected by multiplexer 72 and passed through as signal 74.

Because all data bits 15$l$, 15$j$, 15$k$, etc. of DATA_IN_TEST data pattern bus 15 will be in the same testing mode at a given time, i.e. simultaneously subject to the same testing command such as "Read" or "Write" or "Idle" at the same time, etc., and must therefore be treated in parallel, the only difference between two parallel data is its background which is representative of its logical value during a testing access of the RAM. The shift register circuitry of FIG. 1 thus uses only one or a limited number of DATA_IN_TEST inputs per placement of the invention thereby simplifying the routing channels of the RAM since only one or a small number of extra connections is required to provide testing information to the RAM. Before a given test pattern is provided to the I/O buffers, certain "mask" or programming information signal 26 is shifted into the shift register. This programming information 26 will either cause data background pattern bus DATA_IN_TEST data bits 15$i$, 15$j$, 15$k$ to be inverted (if one) or not inverted (if zero), thereby allowing any possible data background for a given pattern to be easily applied into the RAM, at almost no silicon expense. The number of testing patterns is virtually unlimited because all $2^n$ combination on an n-bit bus can be applied, one after the other. At the same time, the external tester of the memory device is greatly simplified or, if using a BIST machine, test development complexity is greatly reduced by providing only one data information rather than having to increase the data bus width of the array in order to accomplish testing. The routage between the BIST or external testing machine and the RAM memory(ies) is limited to three wires for DATA_IN_TEST bus 15, programming information signal 26, and clock signal 24, exclusive of the diagnostic signals coming from the memory. This routage will be remain the same for all memory formats, with the length of the shift register (number of placements) being the main parameter to control. Control can be provided directly by a BIST machine or the external test equipment to ensure programmability. The test pattern content of the shift register is provided by any appropriate state machine, which may be either external or internal to the RAM.

Figure 3:
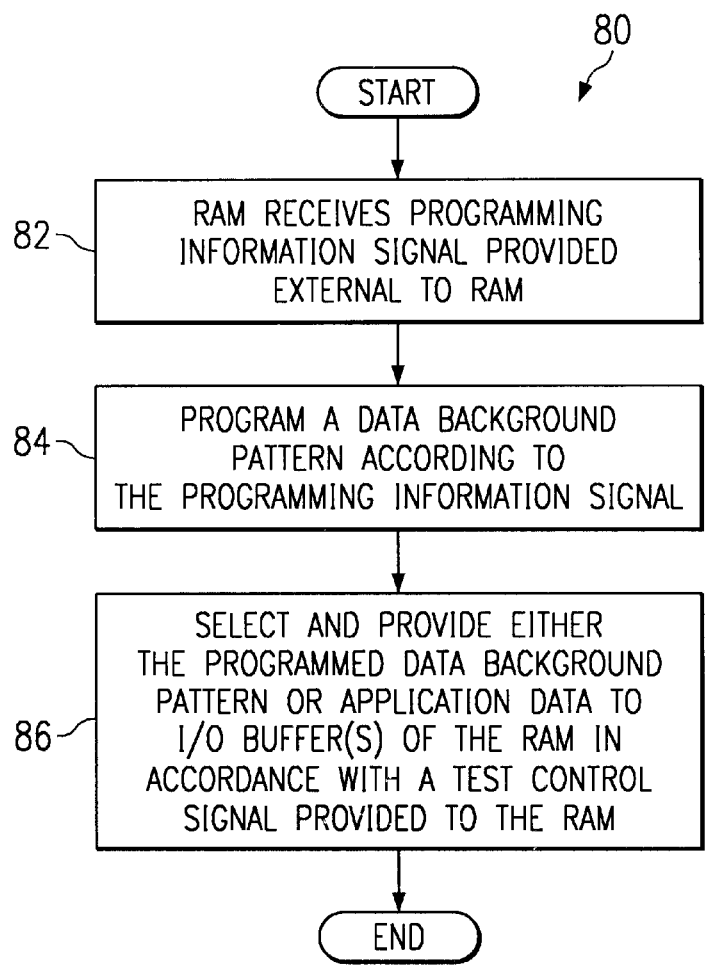
FIG. 3 is a flow chart of the methodology of the present invention for providing programmability of the data background patterns used to test random-access-memories, according to the present invention.

The methodology of the present invention is shown by flowchart 80 of FIG. 3. It is hereby noted that this methodology may be implemented using the circuitry of FIG. 1 or other structures capable of providing the same methodology. At Block 82, the first step of the methodology is that the RAM receives programming information provided to it from an external source, such as by the BIST machine or external testing equipment. The structural embodiment of FIG. 1 implements this step by the shift register receiving programming information signal 26. At the next step, at Block 84, a data background pattern is programmed according to the programming information that has been received at Block 82. In FIG. 1, this is accomplished by the XOR gating function that programs the data bit from DATA_IN_TEST data bus 15 according to the output signal 28 of shift register 22. Finally, at Block 86, a decision about which type of data to provide to I/O buffers of the RAM, either test data or application data, is made according to a test mode control signal. The programmed data background pattern is selected and provided to the I/O buffers of the RAM if the test control signal indicates that the RAM is in a testing mode during which the programmed data pattern data would be needed by the RAM. Conversely, the application data is selected and provided to the I/O buffers of the RAM if the test control signal indicates that the RAM is in a normal operating mode during which regular application data is needed by the RAM.

Figure 2:
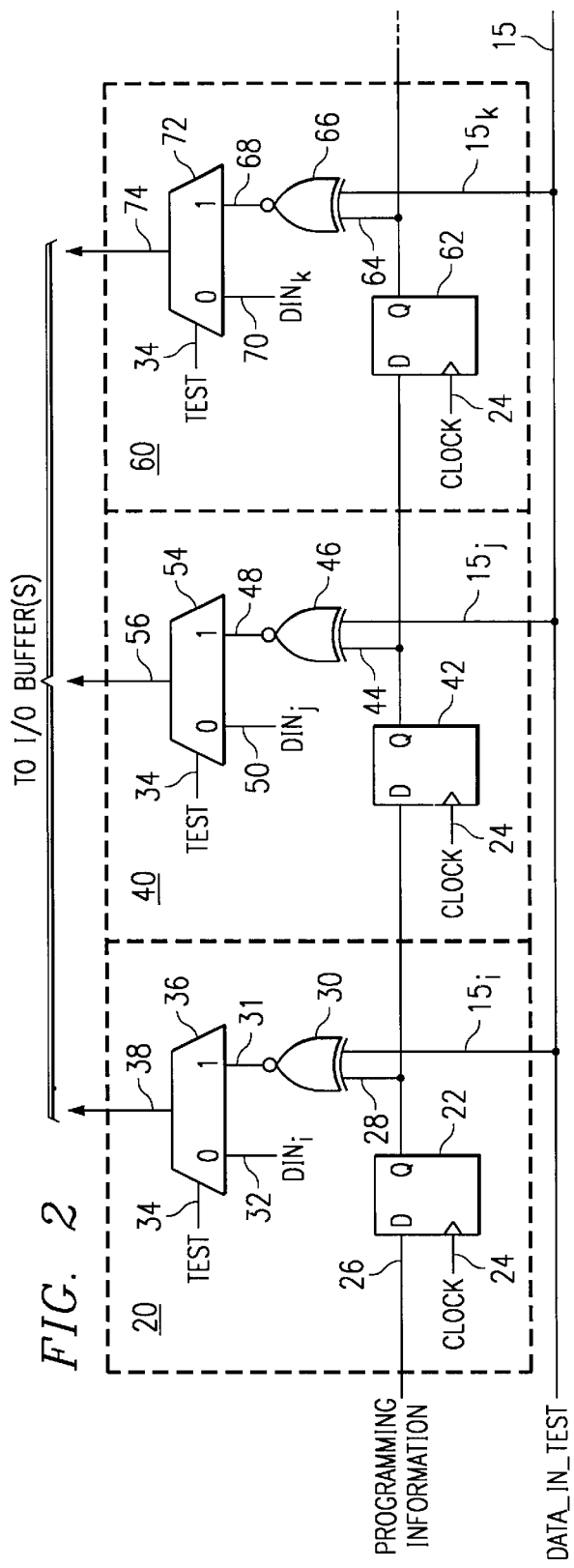
FIG. 2 is a schematic diagram of circuitry of a random-access-memory that is capable of generating programmed data background patterns for testing random-access-memories, according to the present invention.
Figure 4:
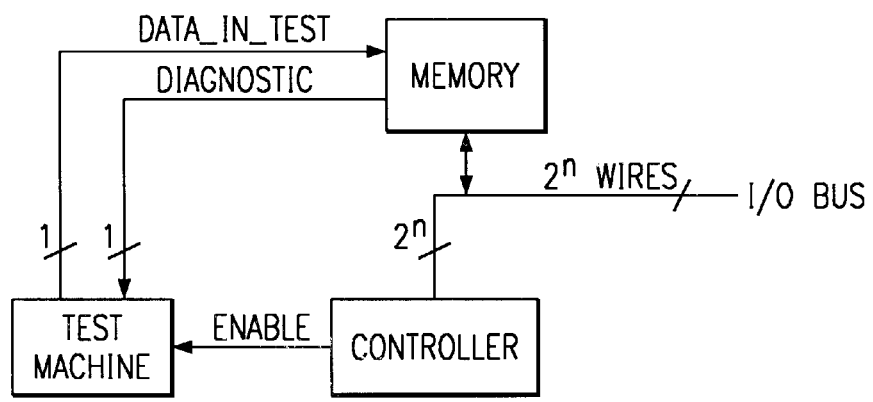
FIG. 4 is a block diagram of an embedded memory application that utilizes the present invention.

Referring now to FIG. 4, an example of the present invention in an embedded memory environment is illustrated. The advantages of this block diagram over the prior art block diagram of FIG. 1 are clear. The circuitry of FIG. 2 is incorporated in the Memory block. It can be seen that the only one extra input pin of the Memory is necessary to provide the data patterns (DATA_IN_TEST) for testing the Memory from the Test Machine, whether an internal BIST machine that resides with the embedded memory on the device or an external test machine outside the device, to the circuitry of FIG. 2 which resides inside the Memory block. Diagnostic information, such as pass, fail, idle, etc., is provided to the Test Machine directly from the Memory as shown. The Test Machine is reduced to a single output pattern generator that provides data patterns for testing and thus occupies very little silicon of the device, if an internal BIST machine. Moreover, the Test Machine correspondingly consumes much less energy since there is only one I/O buffer to which data is supplied, instead of the 128 or 256 buffers that might be required in the prior art FIG. 2, for example, in the case of a 128 bit or 256 bit wide data bus.

The present invention allows a drastic simplification of the test machine by reducing the number of gates required while at the same time providing complete programmability of the backgrounds for a given testing pattern. The complexity of the test machine is greatly reduced as only one data signal need be provided to the shift register circuitry; thus only one extra pin is required on the memory device to provide the data patterns from the test machine. The simplification in number of gates is estimated to be between a factor of 10 to 100, without even taking into account the enhancement in programmability of the invention. Referring back to the 8-bit example discussed in the Background of the Invention section above, the present invention eliminates the need to drive all 8 bits at the same time in order to adequately test the memory. The BIST or external tester can load the pattern through the shift register and apply it to the exclusive OR (XORs) gates. In the most streamlined testing available, the external or BIST tester therefore need only provide a '1' or '0' as stimulus since the testing patterns are generated by the XORs functionality.

While the invention has been particularly shown and described with reference to a preferred embodiment, it will be understood by those skilled in the art that various changes in form and detail may be made therein without departing from the spirit and scope of the invention. For instance, it is understood that the present invention is applicable to any random-access-memory, including RAMs, DRAM, and embedded RAMs.

What is claimed:

1. Circuitry of a random access memory (RAM) that provides programmability of data background patterns used to test the RAM, comprising:

a programming element that receives a programming information signal and a data bit of a data background pattern and programs the data bit of the data background pattern in accordance with the programming information signal to generate a programmed data bit; and a selection element controlled by a test control signal that receives an application data bit and the programmed data bit and outputs either the application data bit or the programmed data bit in accordance with the test control signal, wherein when the test control signal is a first logic state indicative of a testing mode of the RAM the selection element selects and outputs the programmed data bit to an input/output buffer of the RAM and when the test control signal is a second logic state indicative of a normal operating mode of the RAM the selection element selects and outputs the application data bit to the input/output buffer of the RAM.

2. The circuitry of claim 1, wherein the programming element comprises:

a shift register element that receives a programming information signal and a clock signal and shifts in and outputs the programming information signal in accordance with the clock signal; and a logic element that receives the programming information signal from the shift register and a data bit of a data background pattern and performs an exclusive- or (XOR) function on the programming information signal and the data bit of the data background pattern to generate a programmed data bit.

3. The circuitry of claim 1, wherein the selection element comprises:

a multiplexer element controlled by a test control signal that receives an application data bit and the programmed data bit, wherein when the test control signal is a first logic state indicative of a testing mode of the RAM the multiplexer element selects and outputs the programmed data bit to an input/output buffer of the RAM and when the test control signal is a second logic state indicative of a normal operating mode of the RAM the multiplexer element selects and outputs the application data bit to the input/output buffer of the RAM.

4. The circuitry of claim 1, wherein the programming element comprises:

a shift register element that receives a programming information signal and a clock signal and shifts in and outputs the programming information signal in accordance with the clock signal; and a logic element that receives the programming information signal from the shift register and a data bit of a data background pattern and performs an exclusive- or (XOR) function on the programming information signal and the data bit of the data background pattern to generate a programmed data bit; and wherein the selection element comprises:

a multiplexer element controlled by a test control signal that receives an application data bit and the programmed data bit, wherein when the test control signal is a first logic state indicative of a testing mode of the RAM the multiplexer element selects and outputs the programmed data bit to an input/output buffer of the RAM and when the test control signal is a second logic state indicative of a normal operating mode of the RAM the multiplexer element selects and outputs the application data bit to the input/output buffer of the RAM.

5. Circuitry of a random access memory (RAM) that provides for programmability of data background patterns used to test the RAM, comprising:

a programming element that receives a programming information signal and one or more data bits comprising a data background pattern and programs the one or more data bits in accordance with the programming information signal to generate a programmed data background pattern; and a selection element controlled by a test control signal that receives an application data and the programmed data background pattern and outputs either the application data or the programmed data background pattern in accordance with the test control signal, wherein when the test control signal is a first logic state indicative of a testing mode of the RAM the selection element selects and outputs the programmed data to an input/output buffer of the RAM and when the test control signal is a second logic state indicative of a normal operating mode of the RAM the selection element selects and outputs the application data to the input/output buffer of the RAM.

6. The circuitry of claim 5, wherein for each data bit of the data background pattern the programming element comprises:

a shift register element that receives the programming information signal and a clock signal and shifts in and outputs the programming information signal in accordance with the clock signal; and a logic element that receives the programming information signal from the shift register and a data bit of a data background pattern and performs an exclusive- or (XOR) function on the programming information signal and the data bit of the data background pattern to generate a programmed data bit; and wherein for each data bit of the data background pattern the selection element comprises:

a multiplexer element controlled by a test control signal that receives an application data bit and the programmed data bit, wherein when the test control signal is a first logic state indicative of a testing mode of the RAM the multiplexer element selects and outputs the programmed data bit to an input/output buffer of the RAM and when the test control signal is a second logic state indicative of a normal operating mode of the RAM the multiplexer element selects and outputs the application data bit to the input/output buffer of the RAM.

7. Circuitry of a random access memory (RAM) that provides for programmability of data background patterns used to test the RAM, comprising:

means for programming a plurality of data bits of a data background pattern in accordance with programming information signal to generate a programmed data background pattern; and means for selecting either the programmed data background or an application data to provide to an input/output buffer of the RAM in accordance with a test control signal, wherein when the test control signal is a first logic state indicative of a testing mode of the RAM the programmed data background is provided to an input/output buffer of the RAM and when the test control signal is a second logic state indicative of a normal operating mode of the RAM the application data is provided to the input/output buffer of the RAM.

8. The circuitry of claim 7, wherein the means for programming comprises:

a plurality of shift register elements, one for each data bit of a plurality of data bits of a data background pattern, that each receive a programming information signal and a clock signal and shift in and output the programming information signal in accordance with the clock signal to generate a plurality of clocked programming information signals; and a plurality of logic elements, one for each data bit of the plurality of data bits of the data background pattern, that each receive a clocked programming information signal of the plurality of clocked programming information signals from a corresponding shift register element of the plurality of shift register elements, receive a corresponding data bit of the plurality of data bits of the data background pattern, and perform an exclusive-or (XOR) function on the clocked programming information signal and the corresponding data bit of the data background pattern to generate a plurality of programmed data bits; and wherein the means for selecting comprises:

a plurality of multiplexer elements, one for each data bit of the plurality of data bits of the data background pattern, that are each controlled by a test control signal and that each receive a corresponding application data bit of a plurality of application data bits of an application data and a programmed data bit of the plurality of programmed data bits, wherein when the test control signal is a first logic state indicative of a testing mode of the RAM the plurality of multiplexer elements select and output the plurality of programmed data bits to an input/output buffer of the RAM and when the test control signal is a second logic state indicative of a normal operating mode of the RAM the multiplexer elements select and output the plurality of application data bits of the application data to the input/output buffer of the RAM.

9. Circuitry of a random access memory (RAM) that provides for programmability of data background patterns used to test the RAM, comprising:

a shift register element that receives a programming information signal and a clock signal and shifts in and outputs the programming information signal in accordance with the clock signal;

a logic element that receives the programming information signal from the shift register and a data bit of a data background pattern and performs an exclusive- or (XOR) function on the programming information signal and the data bit of the data background pattern to generate a programmed data bit; and a multiplexer element controlled by a test control signal that receives an application data bit and the programmed data bit, wherein when the test control signal is a first logic state indicative of a testing mode of the RAM the multiplexer element selects and outputs the programmed data bit to an input/output buffer of the RAM and when the test control signal is a second logic state indicative of a normal operating mode of the RAM the multiplexer element selects and outputs the application data bit to the input/output buffer of the RAM.

10. The circuitry of claim 9, wherein the data background pattern is provided to the shift register by a built-in-self-test (BIST) machine of the random access memory.

11. The circuitry of claim 9, wherein the data background pattern is provided to the shift register by an external test machine that is external to the random access memory.

12. Circuitry of a random access memory (RAM) that provides for programmability of data background patterns used to test the RAM, comprising:

a plurality of shift register elements, one for each data bit of a plurality of data bits of a data background pattern, that each receive a programming information signal and a clock signal and shift in and output the programming information signal in accordance with the clock signal to generate a plurality of clocked programming information signals;

a plurality of logic elements, one for each data bit of the plurality of data bits of the data background pattern, that each receive a clocked programming information signal of the plurality of clocked programming information signals from a corresponding shift register element of the plurality of shift register elements, receive a corresponding data bit of the plurality of data bits of the data background pattern, and perform an exclusive-or (XOR) function on the clocked programming information signal and the corresponding data bit of the data background pattern to generate a plurality of programmed data bits; and a plurality of multiplexer elements, one for each data bit of the plurality of data bits of the data background pattern, that are each controlled by a test control signal and that each receive a corresponding application data bit of a plurality of application data bits of an application data and a programmed data bit of the plurality of programmed data bits, wherein when the test control signal is a first logic state indicative of a testing mode of the RAM the plurality of multiplexer elements select and output the plurality of programmed data bits to an input/output buffer of the RAM and when the test control signal is a second logic state indicative of a normal operating mode of the RAM the multiplexer elements select and output the plurality of application data bits of the application data to the input/output buffer of the RAM.

13. The circuitry of claim 12, wherein the data background pattern is provided to the shift register by a built-in-self-test (BIST) machine of the random access memory.

14. The circuitry of claim 12, wherein the data background pattern is provided to the shift register by an external test machine that is external to the random access memory.

15. A method for programming data background patterns used to test the RAM, comprising the steps of:

providing a data background pattern comprising a plurality of data bits to a RAM to be tested;

providing a programming information signal to the RAM;

selectively programming the plurality of data bits of the data background pattern in accordance with the programming information signal provided to the RAM to generate a programmed test data pattern; and providing the programmed test data pattern to one or more input/output buffers of the RAM when the RAM is in a testing mode as indicated by a test control signal.

16. The method of claim 15, wherein the step of providing a data background pattern to a RAM to be tested is accomplished by a built-in-self-test (BIST) machine of the random access memory.

17. The method of claim 15, wherein the step of providing a data background pattern to a RAM to be tested is accomplished by an external test machine that is external to the random access memory.

18. The method of claim 15, wherein providing the programming information signal to the RAM is accomplished by shifting in the programming information signal to a shift register of the RAM.

19. The method of claim 15, wherein the step of selectively programming the plurality of data bits of the data background pattern to generate the programmed test data pattern is accomplished by selectively inverting or not inverting each bit of the plurality of data bits of the data background pattern according to the programming information signal provided to the RAM.

20. The method of claim 15, further comprising providing an application data to the one or more input/output buffers of the RAM when the RAM is in a normal operating mode as indicated by the test control signal.

* * * * *